United States Patent [19]

Ozawa

[11] 4,377,029
[45] Mar. 22, 1983

[54] PROCESS FOR FABRICATING A BIPOLAR INTEGRATED CIRCUIT HAVING CAPACITORS

[75] Inventor: Osamu Ozawa, Yokohama, Japan

[73] Assignee: Tokyo Shibaura Denki Kabushiki Kaisha, Kawasaki, Japan

[21] Appl. No.: 213,919

[22] Filed: Dec. 8, 1980

[30] Foreign Application Priority Data

Dec. 15, 1979 [JP] Japan .............................. 54-163242

[51] Int. Cl.$^3$ ....................... H01L 27/04; H01L 27/02
[52] U.S. Cl. .................................. 29/576 B; 29/571; 148/1.5; 357/14; 357/34; 357/51; 357/91
[58] Field of Search ............... 29/576 B, 571; 148/1.5; 357/14, 41, 51, 91, 34

[56] References Cited

U.S. PATENT DOCUMENTS

| | | | |
|---|---|---|---|
| 3,906,539 | 9/1975 | Sauermann et al. | 357/14 |
| 4,003,076 | 1/1977 | Polata et al. | 357/14 |
| 4,046,605 | 9/1977 | Nelson et al. | 148/175 |
| 4,100,565 | 7/1978 | Khajezadeh | 357/51 |
| 4,106,048 | 8/1978 | Khajezadeh | 357/40 |
| 4,155,778 | 5/1979 | Antipov | 148/1.5 |
| 4,245,231 | 1/1981 | Davies | 357/51 |
| 4,247,343 | 1/1981 | Kruzhanov et al. | 148/1.5 |

Primary Examiner—Upendra Roy
Attorney, Agent, or Firm—Finnegan, Henderson, Farabow, Garrett & Dunner

[57] ABSTRACT

A process for fabricating a bipolar integrated circuit comprises the steps of:

forming isolation regions in an epitaxial layer of a second conductivity type formed on a semiconductor substrate of a first conductivity type;

forming a thermal oxidation layer on the surface of said epitaxial layer;

forming a diffusion region of the first conductivity type for a lower part electrode by selectively implanting by ion implantation an impurity of the first conductivity type in a capacitor-forming region of surrounded by said isolation region through said thermal oxidation layer and annealing thereafter;

forming a diffusion region of the second conductivity type for an external electrode by selectively diffusing an impurity of the second conductivity type into said capacitor-forming region through a contact hole formed in said thermal oxidation layer; and forming a contact hole for exposing part of said diffusion layer of the first conductivity type; and forming a metal layer for electrodes on the surface of said epitaxial layer containing said thermal oxidation layer and selectively removing said metal layer so as to simultaneously form a lower part electrode connected to said diffusion region of the first conductivity type, an external electrode connected to said diffusion region of the secnd conductivity type, and an upper part electrode covering a large area of said thermal oxidation layer located above said diffusion layer of the first conductivity type.

The process may also include the step of laminating a silicon nitride layer on said thermal oxidation layer after implanting an impurity of the first conductivity type into said capacitor-forming region through said thermal oxidation layer.

5 Claims, 9 Drawing Figures

PROCESS FOR FABRICATING A BIPOLAR INTEGRATED CIRCUIT HAVING CAPACITORS

BACKGROUND OF THE INVENTION

The present invention relates to an improvement in a process for fabricating a bipolar integrated circuit having capacitors.

For fabricating a bipolar integrated circuit of this type, a process as shown in FIGS. 1(A) and 1(B) is conventionally adopted. FIGS. 1(A) and 1(B) show the case wherein npn transistors and capacitors are coexistent.

N+-type buried layers 2 are formed by selective diffusion of As or Sb on a p-type silicon substrate 1. After growing an epitaxial layer 3 of n-type that is opposite to the conductivity of the substrate 1 to a desired concentration and thickness on the silicon substrate 1, p+-type isolation regions 4 as element isolation regions are formed to separate regions for forming npn transistors and capacitors. Thereafter, boron, an impurity of p-type, is selectively diffused in the npn transistor-forming region to form a base 5. After depositing a thick CVD-SiO$_2$ layer 6 on the entire surface of the structure, a diffusion window is formed in the CVD-SiO$_2$ layer 6 at the collector-forming region. After depositing phosphor silicate glass layer 7 (PSG layer 7) on the entire surface of the structure, the parts of the PSG layer 7 and the CVD-SiO$_2$ layer 6 on the capacitor-forming region are selectively removed. An n+-type implanted layer 8 as a lower part electrode diffusion layer of the capacitor is formed by ion implantation or with a diffusion source of POCl$_3$ (FIG. 1(A)).

The structure is annealed in an oxygen atmosphere to diffuse phosphorus in the PSG layer 7 to the npn transistor-forming region of the n-type epitaxial layer 3 for forming an emitter 9 and a collector 10 that are n+-type diffusion layers. Simultaneously with this, an n+-type implanted layer of the capacitor-forming region is diffused to form a lower part electrode diffusion layer 11 and to form a thermal oxidation layer 12 as an insulation layer of the capacitor in the n-type epitaxial layer 3 exposed through the opening. Thereafter, contact holes are formed at the parts of the CVD-SiO$_2$ layer 6 and the PSG layer 7 on the npn transistor-forming region, and at the parts of the PSG layer 7 on the emitter 9 and the collector 10. Another contact hole is formed in the thermal oxidation layer 12 of the capacitor-forming region. An Al layer as an electrode material layer is deposited on the entire surface of the structure and is patterned. Electrodes 13, 14 and 15 for the base, the emitter and the collector, respectively; a lower part electrode 16 connected to the lower part electrode diffusion layer 11 of the capacitor-forming region; and an upper part electrode 17 formed on the thermal oxidation layer 12 are formed to provide a bipolar integrated circuit (FIG. 1(B)).

With such a conventional process, however, the thermal oxidation layer 12 as the insulation layer for the capacitor is formed by annealing the epitaxial layer 3 in which an n+-type impurity is implanted to a high concentration. The layer 12 is thus inferior in quality, promoting the formation of pinholes. This leads to short-circuiting of the lower part electrode diffusion layer 11 and the upper part electrode 17 formed respectively below and on the thermal oxidation layer 12 so that the capacitor may not be formed. Under these circumstances, the thermal oxidation layer must be made thicker for preventing the formation of pinholes therein. When the layer is made thicker, the capacitance of the capacitor is reduced and the area of the capacitor region in the integrated circuit must be made greater for obtaining a predetermined capacitance, so that the chip area must be made greater and the packaging density is disadvantageously degraded.

SUMMARY OF THE INVENTION

It is, therefore, the primary object of the present invention to provide a process for fabricating a bipolar integrated circuit in which the insulation layer separating the diffusion layer connected to a lower part electrode of a capacitor from the upper electrode may be made thinner without causing short-circuiting therebetween, so that the capacitance of the capacitor region may be increased and the packaging density of the integrated circuit may be improved.

In order to accomplish the above and other objects, the present invention provides a process for fabricating a bipolar integrated circuit comprising the steps of:

forming isolation regions in an epitaxial layer of a second conductivity type formed on a semiconductor substrate of a first conductivity type;

forming a thermal oxidation layer on the surface of said epitaxial layer;

forming a diffusion region of the first conductivity type for a lower part electrode by selectively implanting by ion implantation an impurity of the first conductivity type in a capacitor-forming region surrounded by a said isolation region through said thermal oxidation region and annealing thereafter; and forming a diffusion region of the second conductivity type for an external electrode by selectively diffusing an impurity of the second conductivity type into said capacitor-forming region through a contact hole formed in said thermal oxidation layer;

forming a contact hole for exposing part of said diffusion layer of the first conductivity type; and forming a metal layer for electrodes on the surface of said epitaxial layer containing said thermal oxidation layer and selectively removing said metal layer so as to simultaneously form a lower part electrode connected to said diffusion region of the first conductivity type, an external electrode connected to said diffusion region of the second conductivity type, and an upper part electrode covering a large area of said thermal oxidation layer located above said diffusion layer of the first conductivity type.

BRIEF DESCRIPTION OF THE DRAWINGS

This invention can be more fully understood from the following detailed description when taken in conjunction with the accompanying drawings, in which.

DESCRIPTION OF THE PREFERRED EMBODIMENT

Figure 1A:
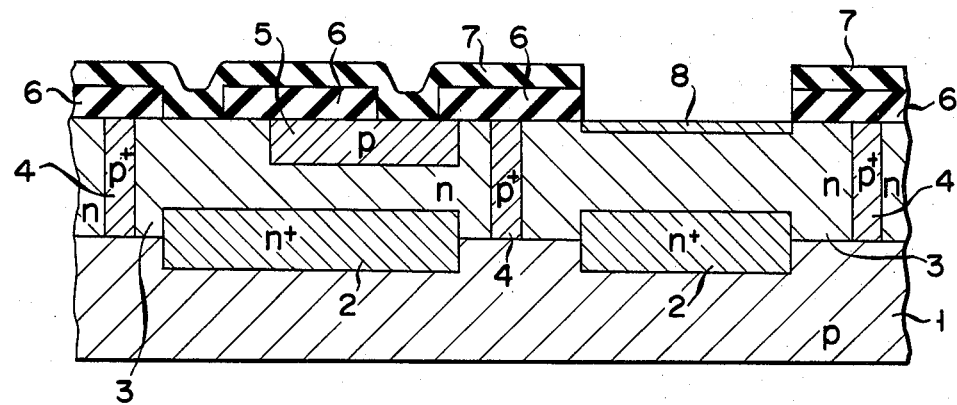
FIGS. 1(A) and 1(B) are sectional views illustrating a conventional process for fabricating a bipolar integrated circuit having a capacitor region.

The element-isolation regions of the present invention may be isolation oxidation films formed by selective oxidation or p+-type isolation regions formed by selective doping of an impurity (e.g., boron) of the first conductivity type.

The thermal oxidation layer of the present invention is used as an insulation layer for the capacitor at the capacitor-forming region. Since the thickness of the thermal oxidation layer has great influence on the capacitance of the capacitor, it is important to make this thickness about 500 to 4,000 Å. When the thickness is below 500 Å, defects such as pinholes tend to occur even when an epitaxial layer of low impurity concentration is annealed. When it exceeds 4,000 Å, the capacitance of the capacitor is significantly reduced.

An impurity of the first conductivity type (e.g., boron) according to the present invention is advantageous in that it may easily be doped by ion implantation through the thermal oxidation layer to an underlying epitaxial layer of the second conductivity type (n-type). The ion implantation of the impurity of the first conductivity type may be used not only for forming the lower part electrode diffusion layer of the capacitor-forming region but also for forming the base of the npn transistor-forming region. Since the formation of the lower part electrode diffusion layer in the capacitor-forming region and the formation of the base of the npn transistor can be performed simultaneously, the process may be simplified and the productivity of the bipolar integrated circuits may be improved. Alternatively, after forming the lower part electrode diffusion layer in the capacitor-forming region by ion implantation of an impurity of the first conductivity type, a thin silicon nitride layer may be deposited on the thermal oxidation layer. When the silicon nitride layer is formed on the thermal oxidation layer, the insulation layer of the capacitor may be of a two-layer structure consisting of the thermal oxidation layer and the silicon nitride layer having a dielectric constant twice that of the thermal oxidation layer. Short-circuiting between the upper part electrode and the lower part electrode diffusion layer due to formation of fine pinholes in the thermal oxidation layer may be prevented with certainty and the capacitance of the capacitor may be significantly improved. When the insulation layer of the capacitor is of bilaminate structure consisting of the thermal oxidation layer and the silicon nitride layer, the overall thickness of the layers is within the range of 500 to 4,000 Å. More preferably, the thermal oxidation thickness is 250 to 2,000 Å and the silicon nitride layer thickness is 250-2,000 Å.

The diffusion layer of the second conductivity type formed at the capacitor-forming region and the external electrode connected thereto function to prevent the formation of a pnp parasitic transistor in the p-type substrate/n-type epitaxial layer/p+-type lower part electrode diffusion layer. As a means for forming such a diffusion layer of the second conductivity type, methods may be adopted such as a method wherein diffusion is performed with POCl$_3$, an arsenic silicate glass layer (AsSG layer) or a phosphor silicate glass layer (PSG layer) as the n-type impurity diffusion source. In this case, it is also possible to form the emitter and the collector of the npn transistor-forming region with this diffusion source.

An example of the present invention will now be described referring to FIGS. 2(A) to 2(E). In this example, the steps for juxtaposing the npn transistor and the capacitor alone are shown, and the steps for forming the pnp transistor and the resistor regions are omitted.

EXAMPLE (i) N+-type buried layers 102 were formed by selective diffusion of As or Sb on a p-type silicon substrate 101. After forming an n-type silicon epitaxial layer 103 of the opposite conductivity type as that of the silicon substrate 101 thereon, boron was selectively diffused using the thermal oxidation layer or the CVD oxidation layer as a mask to form p+-type isolation regions 104 as the element isolation regions for separating the silicon epitaxial layer 103 into a transistor-forming region 105, a capacitor-forming region 106, and so on (FIG. 2(A)).

(ii) A thermal oxidation was performed in a dry oxygen atmosphere at 1,000° C. to grow a thermal oxidation layer 107 of 1,000 Å thickness on the entire surface of the silicon epitaxial layer 103. After forming a resist pattern 108 with the openings for the base 109 and the lower part electrode diffusion layer 110, boron was ion-implanted through the thermal oxidation layer 107 using the resist pattern as a mask (FIG. 2(B)). After ion implantation, thermal diffusion was performed to diffuse the boron ion-implanted layer to a desired depth so as to form a base 109, that is, a p-type diffusion layer in the transistor-forming region 105 and a p-type lower part electrode diffusion layer 110 in the capacitor-forming region 106. When adopting a double structure of p+-type and p-type for reducing the base resistance of the linear transistor, it is preferable that the lower part diffusion region 110 of the capacitor be a p+-type diffusion layer. During this diffusion process, defects introduced by the ion implantation in the thermal oxidation layer 107 were reduced by annealing, providing an oxide layer of superior quality.

(iii) A silicon nitride layer 111 of 1,000 Å thickness was formed on the entire surface of the thermal oxidation layer 107. An emitter diffusion window 112, a collector diffusion window 113 and a base contact hole 114 were formed at parts of the silicon nitride layer 111 on the transistor forming region 105. An n+-type diffusion window 115 and a contact hole 116 allowing access to the lower part electrode diffusion layer 110 were formed at parts of the nitride silicon layer 111 on the capacitor-forming region 106. The contact holes 114 and 116 were covered with a resist. The thermal oxidation layer 107 exposed through the diffusion windows 112, 113 and 115 was removed, and the resist was also removed thereafter (FIG. 2(C)).

(iv) After depositing a low temperature oxidation layer 117 with phosphorus (PSG layer) on the entire surface, heating was preformed to diffuse phosphorus from the PSG layer 117 through the diffusion windows 112 and 113 to the transistor-forming region 105 of the epitaxial layer 103 to form an emitter region 118 and a collector region 119 consisting of n+-type diffusion layers. Phosphorus was also diffused through the diffusion window 115 to the capacitor-forming region 106 to form an n+-type diffusion layer 120 (FIG. 2(D)).

Figure 3:
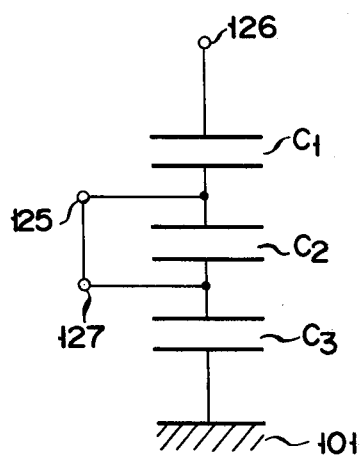
FIG. 3 is a view illustrating one form of the equivalent circuit of the capacitor region of the bipolar integrated circuit obtained in the embodiment of the present invention.

(v) The PSG layer 117 was etched away completely. The substrate was entirely immersed in dilute hydrofluoric acid to remove the thermal oxidation layer 107 exposed through the contact holes 114 and 116 of the silicon nitride layer 111. After depositing a CVD-SiO$_2$ layer 121 (alternatively a bilaminate structure consisting of a CVD-SiO$_2$ layer and a PSG layer) of 6,000 Å thickness on the entire surface, contact holes were formed at parts of the CVD-SiO$_2$ layer 121 on the diffusion layers of the transistor-forming region 105 and the capacitor-forming region 106. The part of the CVD-SiO$_2$ layer 121 on the lower part electrode diffusion layer 110 of the capacitor-forming region 106 was also removed. The entire surface was coated with an Al layer and the Al layer was patterned to form electrodes 122, 123 and 124 for the base, the emitter and the collector, respectively; a lower part electrode 125 connected to the lower part electrode diffusion layer 110 of the capacitor-forming region; an upper part electrode 126 on the silicon nitride layer 111; and an external electrode 127 connected to the n$^+$-type diffusion layer 120. A bipolar integrated circuit having an npn transistor region and a capacitor region was thus fabricated (FIG. 2(E)). The equivalent circuit of the capacitor region of such a bipolar integrated circuit is shown in FIG. 3. Referring to this figure, C1 denotes a MOS capacitor consisting of the p-type lower part electrode diffusion layer 110 and the upper part electrode 126. C2 denotes a junction capacitor consisting of the p-type lower part electrode diffusion layer 110 and the n-type silicon epitaxial layer 103. C3 denotes a total junction capacitor consisting of a capacitor component between the n-type epitaxial layer 103 and the isolation region 104, a capacitor component between the p-type silicon substrate 101 and the n-type epitaxial layer 103, and a capacitor component between the p-type silicon substrate 101 and the n$^+$-type buried layer 102. The p-type silicon substrate 101 is at ground potential.

Figure 1B:
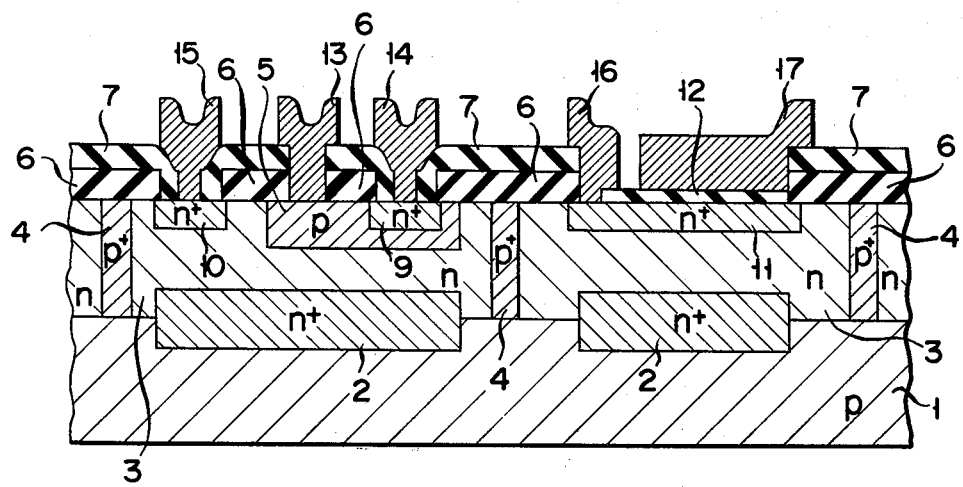
Figure 2A:
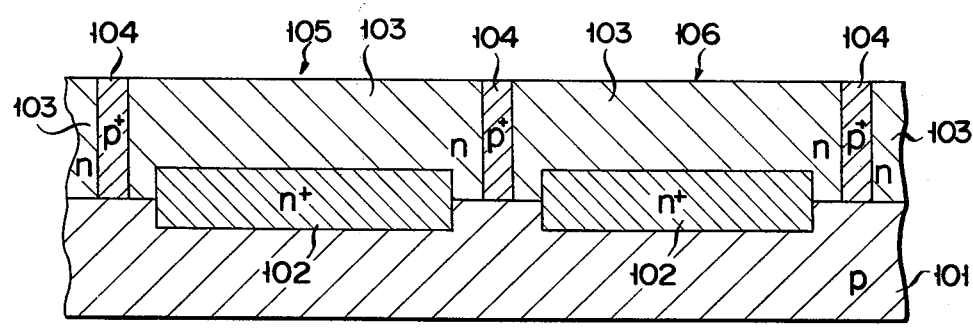
FIGS. 2(A) to 2(E) are sectional views illustrating a process for fabricating a bipolar integrated circuit having a capacitor region according to the embodiment of the present invention.
Figure 2B:
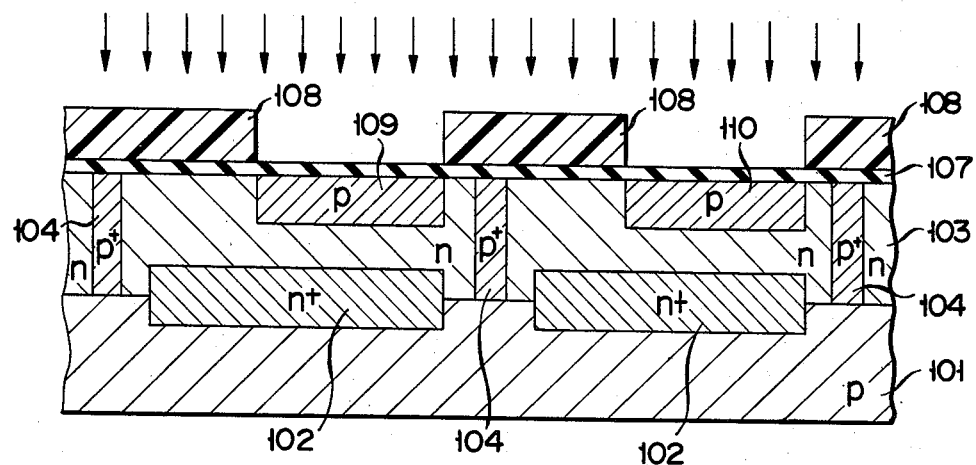
Figure 2C:
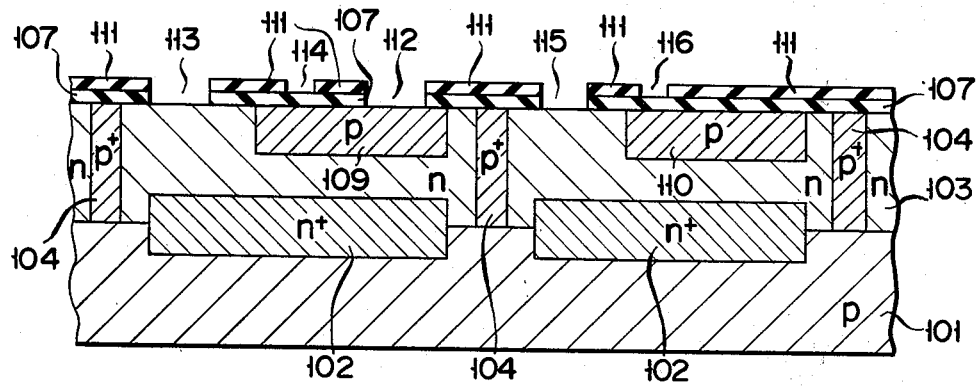
Figure 2D:
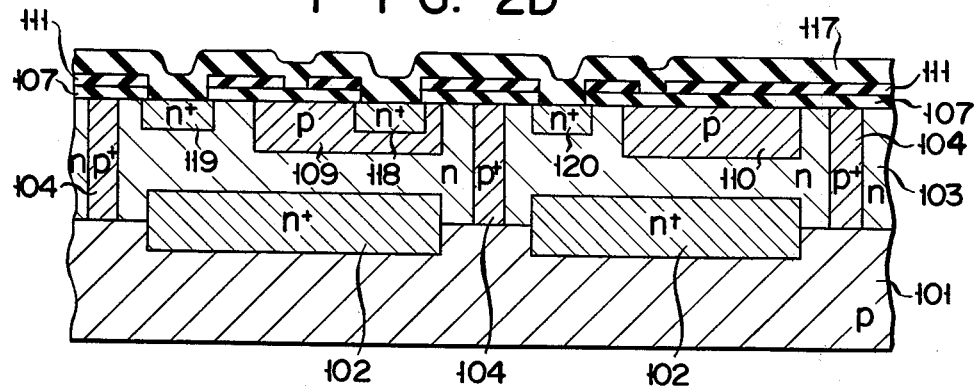
Figure 2E:
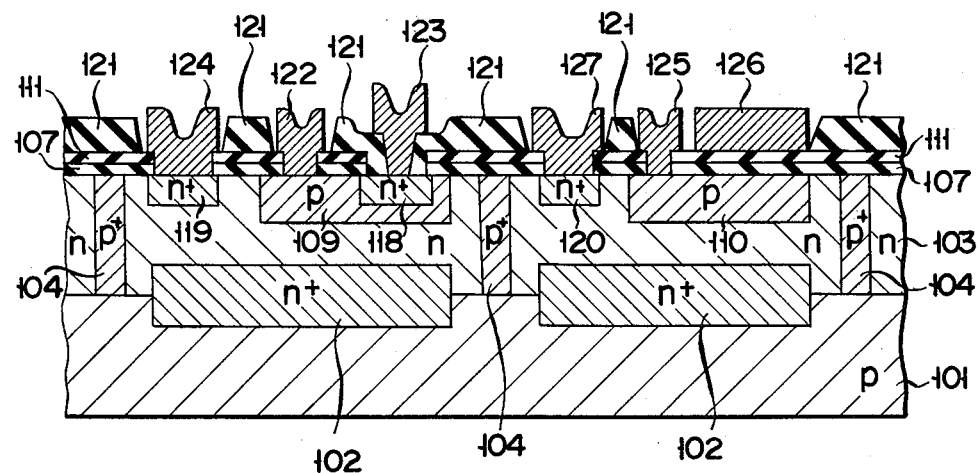

As has been already described with reference to the example of the present invention, the insulation layer constituting the MOS capacitor C1 of the capacitor region is of a two-layer structure consisting of the silicon nitride layer 111 and the thermal oxidation layer 107 obtained by thermal oxidation of the n-type silicon epitaxial layer 103 of low impurity concentration. The thermal oxidation layer 107 has a smaller number of pinholes than those of the thermal oxidation layer 12 shown in the conventional FIG. 1(B). The silicon nitride layer 111 has a high dielectric constant and functions to fill the pinholes in the thermal oxidation layer 107. Accordingly, short-circuiting between the lower part electrode diffusion layer 110 and the upper part electrode 126 through the pinholes may be prevented, and MOS capacitors of larger capacitance may be formed therebetween. As a result, sufficient capacitance may be obtained without enlarging the area of the capacitor region as has been the case with the conventional process, and a bipolar integrated circuit with high packaging density may be obtained. Further, as was described with reference to the example, the p-type base 109 of the transistor-forming region and the p-type lower part electrode diffusion layer 110 of the capacitor-forming region may be formed by selective ion implantation of boron using the resist pattern 108 as a mask, so that the process may be simplified.

Figure 4:
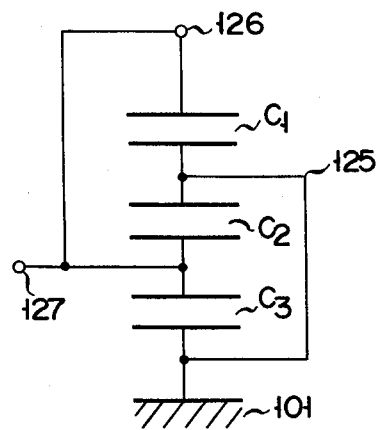
FIG. 4 is a view illustrating another form of the equivalent circuit of the capacitor region of the bipolar integrated circuit obtained in the embodiment of the present invention.

The capacitors C1, C2 and C3 were connected in the equivalent circuit shown in FIG. 3. But as shown in FIG. 4 the capacitor region may be formed by connecting the p-type lower part electrode diffusion layer 110 to ground through the lower part electrode 125 and connecting the upper part electrode 126 to the external electrode 127 connected to the n$^+$-type diffusion layer 120. For connecting the lower part electrode 125 to ground, it may, for example, be connected to the p$^+$-type isolation region 104 surrounding the capacitor region. With such a connection, the capacitors C1, C2 and C3 are connected in parallel with each other between the upper part electrode 126 (and the external electrode 127) and ground, so that a large capacitance may be obtained with the capacitor region of small area.

In summary, according to the present invention, the thermal oxidation layer as the insulation layer of the capacitors interposed between the p-type lower part electrode diffusion layer and the upper part electrode of the capacitor region is improved. The thickness of the thermal oxidation layer may be reduced without causing short-circuiting between the diffusion layer and the upper part electrode, and the capacitance of the capacitor region may be increased. Formation of a pnp parasitic transistor as mentioned above may be prevented by the n$^+$-type diffusion layer and the external electrode connected thereto formed at the capacitor region. The present invention thus provides a method for fabricating a bipolar integrated circuit according to which the capacitor region area may be reduced, the packaging density may be improved, and the operation characteristics may be superior.

What is claimed is:

1. A process for fabricating a bipolar integrated circuit having a capacitor comprising the steps of:
   forming isolation regions in an epitaxial layer of a second conductivity type formed on a semiconductor substrate of a first conductivity type;
   forming a thermal oxidation layer on the surface of said epitaxial layer;
   forming a diffusion region of the first conductivity type for a lower part electrode by selectively implanting by ion implantation an impurity of the first conductivity type in a capacitor-forming region surrounded by a said isolation region throughout said thermal oxidation layer and annealing thereafter; forming a diffusion region of the second conductivity type for an external electrode by selectively diffusing an impurity of the second conductivity type into said capacitor-forming region through a contact hole formed in said thermal oxidation layer; and
   forming a contact hole for exposing part of said diffusion layer of the first conductivity type; and forming a metal layer for electrodes on the surface of said epitaxial layer containing said thermal oxidation layer and selectively removing said metal layer so as to simultaneously form a lower part electrode connected to said diffusion region of the first conductivity type, an external electrode connected to said diffusion region of the second conductivity type, and an upper part electrode covering a large area of said thermal oxidation layer located above said diffusion layer of the first conductivity type,
   wherein said thermal oxidation layer forms the insulation layer of a capacitor interposed between said lower part electrode diffusion layer and said upper part electrode of the capacitor region.

2. A process according to claim 1, further comprising the step of forming a silicon nitride layer on said thermal oxidation layer after implanting an impurity of the first conductivity type into said capacitor-forming region through said thermal oxidation layer.

3. A process according to claim 1, wherein the formation of the base region of an npn transistor in said epitaxial layer is performed simultaneously with the formation of said diffusion region of the first conductivity type.

4. A process according to claim 1, wherein the thickness of said thermal oxidation layer is 500–4,000 Å.

5. A process according to claim 2, wherein, the thickness of said thermal oxidation layer is 250–2,000 Å and the thickness of said silicon nitride layer is 250–2,000 Å.

* * * * *